(12) United States Patent
Song (10) Patent No.: US 11,456,322 B2
(45) Date of Patent: Sep. 27, 2022

(54) ARRAY SUBSTRATE, MANUFACTURING METHOD THEREOF AND DISPLAY PANEL (71) Applicant: HKC CORPORATION LIMITED, Shenzhen (CN)

(72) Inventor: Zhenli Song, Chongqing (CN)

(73) Assignee: HKC CORPORATION LIMITED, Shenzhen (CN)

(*) Notice: Subject to any disclaimer, the term of this patent is extended or adjusted under 35 U.S.C. 154(b) by 111 days.

(21) Appl. No.: 17/041,439

(22) PCT Filed: Nov. 30, 2018

(86) PCT No.: PCT/CN2018/118415
§ 371 (c)(1),
(2) Date: Sep. 25, 2020

(87) PCT Pub. No.: WO2020/097998
PCT Pub. Date: May 22, 2020

(65) Prior Publication Data
US 2021/0043658 A1  Feb. 11, 2021

(30) Foreign Application Priority Data
Nov. 12, 2018  (CN) .......................... 201811337216.1

(51) Int. Cl.
*H01L 27/12*  (2006.01)

(52) U.S. Cl.
CPC ........ *H01L 27/124* (2013.01); *H01L 27/1248* (2013.01); *H01L 27/1259* (2013.01)

(58) Field of Classification Search
None
See application file for complete search history.

(56) References Cited

U.S. PATENT DOCUMENTS

| 2008/0012017 A1* | 1/2008 | Jung ................. G02F 1/136286 438/30 |
| 2013/0313546 A1* | 11/2013 | Yu ........................ H01L 29/7869 438/34 |
| 2015/0221669 A1* | 8/2015 | Sun ................... H01L 29/78618 257/66 |

FOREIGN PATENT DOCUMENTS

| CN | 105161519 A | 12/2015 |
| CN | 105720012 A | 6/2016 |
| CN | 105932024 A | 9/2016 |
| CN | 107464820 A | 12/2017 |
| CN | 108417580 A | 8/2018 |

OTHER PUBLICATIONS

Yue Zhi, the ISA written comments, dated Aug. 2019, CN.
Yue Zhi, the international Search Report, dated Aug. 2019, CN.

* cited by examiner

*Primary Examiner* — Bo B Jang (57) ABSTRACT

The application discloses an array substrate, a manufacturing method of the array substrate and a display panel. It includes a thin film transistor, and the thin film transistor includes a substrate, a Metal 1, an insulating layer, a semiconductor layer, a barrier layer, a Metal 2, a first passivation layer and a pixel electrode; the Metal 2 includes a source electrode and a drain electrode. A connecting groove is arranged on the barrier layer corresponding to the position of the source electrode and the drain electrode, one end of the connecting groove is connected to the source electrode and the semiconductor layer, and the other end is connected to the drain electrode and the semiconductor layer.

18 Claims, 5 Drawing Sheets

ARRAY SUBSTRATE, MANUFACTURING METHOD THEREOF AND DISPLAY PANEL

CROSS REFERENCE OF RELATED APPLICATIONS

This application claims the priority to the Chinese Patent Application No. CN201811337216.1, filed with National Intellectual Property Administration, PRC on Monday, Nov. 12, 2018 and entitled "ARRAY SUBSTRATE, MANUFACTURING METHOD THEREOF AND DISPLAY PANEL", which is incorporated herein by reference in its entirety.

TECHNICAL FIELD

The present application relates to the field of display technology, in particular to an array substrate, a manufacturing method thereof and a display panel.

BACKGROUND

It should be understood that the statements herein merely provide background information related to the present application and do not necessarily constitute the conventional art.

With the development of modern information technology, Liquid Crystal Display (LCD) and Organic Electro-luminescence Display (OELD) have become mainstream products in the market due to their lightness and low power consumption. There are two kinds of TFT structures in the etching barrier layer in the exemplary technique; the TFT manufacture procedure is stable, but the TFT area is large, which affects the aperture ratio; and the other is a structure in which the thin film transistor has a small area.

In order to prevent etching damage of indium gallium zinc oxide back channel, although the area of thin film transistor is small, the etching is not uniform (incomplete etching or over-etching), and the over-etching easily causes the insulating layer under the etching barrier layer to be etched.

SUMMARY

The application provides an array substrate, a manufacturing method thereof and a display panel to prevent the insulating layer from being too thin duo to over-etching.

The application also discloses an array substrate including a thin film transistor, the thin film transistor includes a substrate, a first metal layer, an insulating layer, a semiconductor layer, a barrier layer, a second metal layer, a first passivation layer and a pixel electrode; the first metal layer is disposed on a surface of the substrate; the insulating layer covers a surface of the first metal layer, the semiconductor layer covers a surface of the insulating layer, the barrier layer covers surfaces of the semiconductor layer and the insulating layer, the second metal layer covers a surface of the barrier layer, the second metal layer includes a source electrode and a drain electrode; the first passivation layer covers a surface of the second metal layer, a pixel electrode is disposed above the first passivation layer, a connecting groove is arranged on the barrier layer corresponding to the position of the source electrode and the drain electrode, one end of the connecting groove is connected to the source electrode and the semiconductor layer, and the other end is connected to the drain electrode and the semiconductor layer.

Optionally, the connecting groove includes a first connection grove and a second connection grove; the first connecting groove and the second connecting groove are connected to each other, and a closed-loop through-groove structure is arranged.

Optionally, the width of the first connecting groove is equal to that of the second connecting groove.

Optionally, the length of the first connecting groove is equal to that of the second connecting groove.

Optionally, the connecting groove includes a first connecting groove and a second connecting groove; the first connecting groove connects the source electrode and the drain electrode with an open-loop through-groove structure.

Optionally, the width of the connecting groove ranges from 3 microns to 15 microns;

Optionally, the thin film transistor includes a color photoresist layer covering a surface of the first passivation layer; a second passivation layer covering a surface of the color photoresist layer, the pixel electrode covers a surface of the second passivation layer, a contact hole penetrating through the first passivation layer, the color photoresist layer and the second passivation layer, and the pixel electrode is connected to the drain electrode through the contact hole.

Optionally, the thin film transistor includes a contact hole penetrating through the first passivation layer, and the pixel electrode is connected to the drain electrode through the contact hole.

Optionally, the first metal layer is a gate electrode.

Optionally, the closed-loop through-groove structure has a quadrilateral through-groove shape.

The present application also discloses a manufacturing method of the array substrate, including:
providing a first metal layer and an insulating layer on the substrate;
providing a semiconductor layer and a barrier layer on the insulating layer;
providing a connecting groove on the barrier layer;
providing a second metal layer on the barrier layer, where the second metal layer includes a source electrode and a drain electrode;
providing a first passivation layer on the second metal layer;
providing a pixel electrode on the first passivation layer, and
providing a contact hole in the first passivation layer that penetrates through the first passivation layer, thus connecting the pixel electrode to the drain electrode of the second metal layer;
where the connecting groove is defined in the barrier layer corresponding to positions of the source electrode and the drain electrode, where one end of the connecting groove is connected to the source electrode and the semiconductor layer, and another end of the connecting groove is connected to the drain electrode and the semiconductor layer.

Optionally, the manufacturing method of the connecting groove includes:
coating a barrier layer material to form the barrier layer;
coating a photoresist on the barrier layer;
exposing and developing the photoresist with a photomask to form a patterned photoresist; and
etching the barrier layer using the patterned photoresist to obtain the connecting groove in the barrier layer.

The present application also discloses a display panel. The display panel includes an array substrate;
and the array substrate includes a thin film transistor, and the thin film transistor including:
a substrate; a first metal layer disposed on a surface of the substrate; an insulating layer covering a surface of the first metal layer; a semiconductor layer covering a surface of the insulating layer; a barrier layer covering surfaces of the semiconductor layer and the insulating layer; a second metal layer covering a surface of the barrier layer, and the second metal layer including a source electrode and a drain electrode; a first passivation layer covering a surface of the second metal layer; a pixel electrode disposed above the first passivation layer; wherein, a connecting groove is arranged on the barrier layer corresponding to the position of the source electrode and the drain electrode, one end of the connecting groove is connected to the source electrode and the semiconductor layer, and the other end is connected to the drain electrode and the semiconductor layer.

Optionally, the connecting groove includes a first connecting groove and a second connecting groove;

the first connecting groove and the second connecting groove are connected to each other, and a closed-loop through-groove structure is arranged.

Optionally, the width of the first connecting groove is equal to that of the second connecting groove.

Optionally, the length of the first connecting groove is equal to that of the second connecting groove.

Optionally, the connecting groove includes a first connecting groove and a second connecting groove; the first connecting groove connects the source electrode and the drain electrode with an open-loop through-groove structure.

Optionally, the insulating layer is a gate-oxide insulating layer.

Optionally, the thin film transistor further includes a third contact hole communicating with the source and the semiconductor layer and connecting the drain electrode and the semiconductor with the second contact hole to form a via.

Optionally, the first contact hole, the second contact hole and the third contact hole have the same shape.

In contrast to an exemplary thin film transistor solution in which the area of the thin film transistor is small, when the barrier layer is etched through dry etch, as the area of the barrier layer to be etched off is too large, etching tends be not uniform (incomplete etching or over-etching), and the over-etching may cause the insulating layer under the barrier layer to be etched, thus the insulating layer film is thinned, which can easily cause electric leakage; the etching area in the present application is small, which prevents incomplete etching and abnormal picture due to damage of over-etching of the barrier layer to the insulating layer, the application has certain advantages for the pixel design of display panels with large size and high resolution requirement.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate or imply relative importance an indication of the number of technical features indicated. Therefore, unless otherwise stated, a feature defined as "first," and "second," may explicitly or implicitly include one or more of the features; "multiple" means two or more. The term "include" and any variations thereof is intended to be inclusive, and may include or add one or more other features, integers, steps, operations, units, components and/or combinations thereof.

In addition, the terms "center", "horizontally", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

The present application will now be described by reference to the accompanying drawings.

Figure 1:
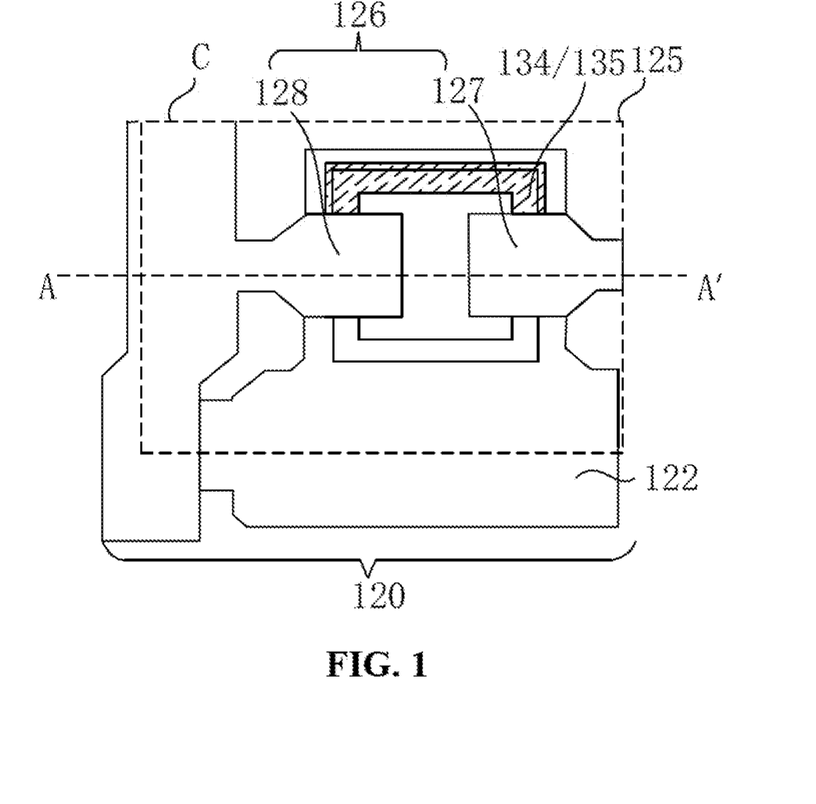
FIG. 1 is a top view of the connecting groove of a thin film transistor of one or more embodiments of the present application.
Figure 2:
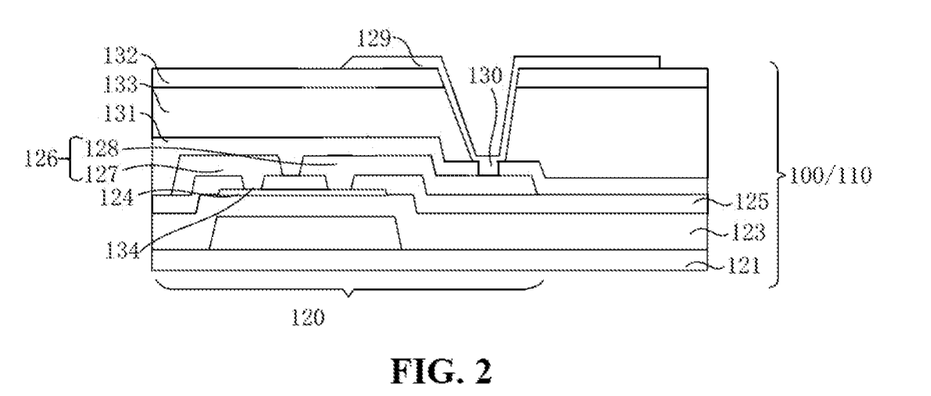
FIG. 2 is a section view of the connecting groove AA' of a thin film transistor of one or more embodiments of the present application.

As shown in FIGS. 1 to 2, one or more embodiments of the application discloses an array substrate 110, including: a thin film transistor 120, and the thin film transistor 120 includes a substrate 121, a first metal layer 122, an insulating layer 123, a semiconductor 124, a barrier layer 125, a second metal layer 126, a first passivation layer 131, a pixel electrode 129; the first metal layer is disposed on a surface of the substrate 121; the insulating layer 123 covers a surface of the first metal layer 122; the semiconductor layer 124 covers a surface of the insulating layer 123; the barrier layer 125 covers surfaces of the semiconductor layer 124 and the insulating layer 123; the second metal layer 126 covers a surface of the barrier layer 125; the second metal layer 126 includes a source electrode 127 and a drain electrode 128; the first passivation layer 131 covers a surface of the second metal layer 126; the pixel electrode 129 is disposed above the first passivation layer 131; a connecting groove 134 is arranged on the barrier layer 125 corresponding to the position of the source electrode 127 and the drain electrode 128, one end of the connection groove 134 is connected to the source electrode 127 and the semiconductor layer 124, and the other end is connected to the drain electrode 128 and the semiconductor layer 124.

In this solution, the display panel 100 of the solution is applicable to the display that is adjacent to the pixel electrode 129 above the first passivation layer 131, and is also applicable to the panel having other layers above the first passivation layer 131, with all layers clinging to the surface; the pixel electrode 129 is disposed above the first passivation layer 131, and the possibility of other layers above the first passivation layer 131 is not excluded; the first metal layer 122 is a gate electrode, the second metal layer 126 includes a source electrode 127 and a drain electrode 128; the position corresponding to the source electrode 127 and drain electrode 128 is provided with a connecting groove, a closed through groove, connecting the semiconductor layer 127 and the source and drain electrode to form a via; etch only needs to be carried out to the closed through groove; compared with the small size area of the exemplary thin film transistor 120, the etching area in this solution is small, and the barrier layer 125 is still retained in other areas; therefore, the insulating layer 123 is also covered with the barrier layer 125, which prevents abnormal picture due to damage of over-etching of the barrier layer to the insulating layer; the application has certain advantages to the pixel design of display panels with large size and high resolution requirement.

As shown in FIG. 1, in one or more embodiments, the connecting groove 134 includes a first connection grove 135; the first connecting groove 135 connects the source electrode 127 and the drain electrode 128 with an open-loop through-groove structure.

In this solution, compared with the previous embodiment, the area of the through groove is smaller, the etched area corresponds to the through groove area, the etched area is smaller, and the other areas except the through groove area are covered with the barrier layer 125, the probability of etching damage to the insulating layer 123 of the lower layer is smaller, therefore, the protection range for the insulating layer 123 is increased, and the risk of thinning the insulating layer 123 caused by over-etching is reduced.

As shown in FIG. 2, in one or more embodiments, the thin film transistor 120 includes: a color photoresist layer 133 covering a surface of the first passivation layer 131; a second passivation layer 132 covering a surface of the color photoresist layer 133; a pixel electrode 129, covering a surface of the second passivation layer 132; a contact hole 130 penetrating through the first passivation layer 131, the color photoresist layer 133 and the second passivation layer 132, and the pixel electrode 129 connected to the drain electrode 128 through the contact hole 130.

In this solution, the color photoresist layer 133 is a red resist layer 133, and may also be a blue resist and a green group; the second passivation layer 132 protects the color photoresist layer 133, the contact hole 130 penetrates the first passivation layer 131, the color photoresist layer 133 and the second passivation layer 132, and the pixel electrode 129 is connected to the drain electrode 128 through the contact hole 130 to form an access.

Figure 3:
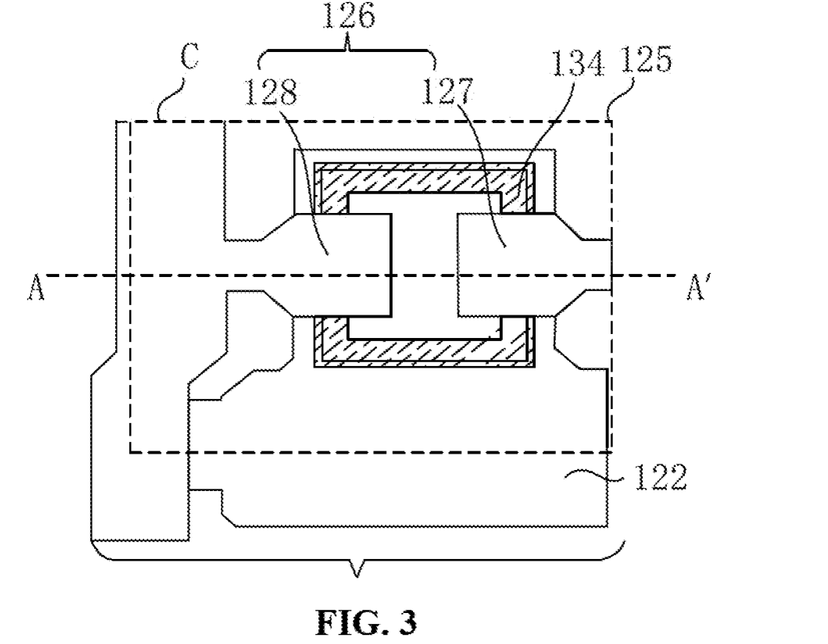
FIG. 3 is a top view of the connecting groove of a thin film transistor of one or more embodiments of the present application.
Figure 4:
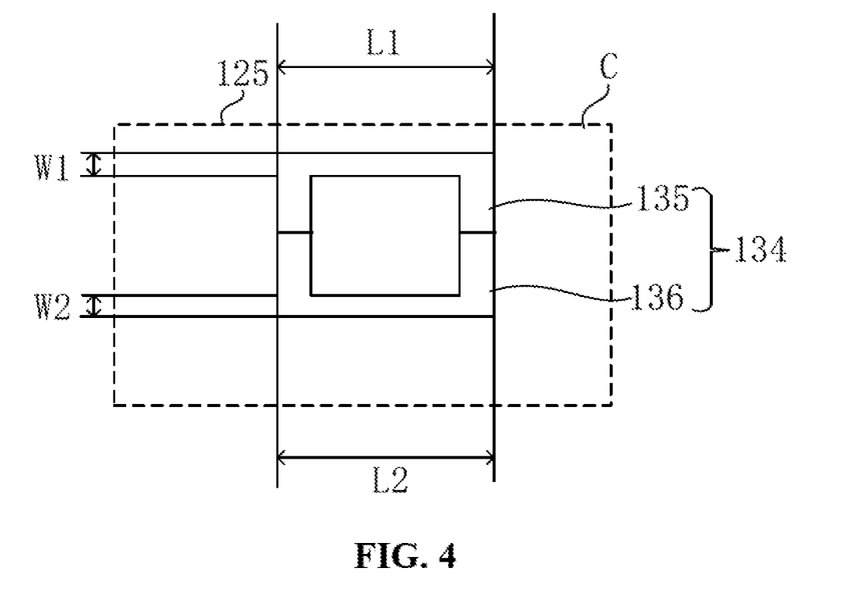
FIG. 4 is a top view of a barrier layer C of one or more embodiments of the present application.

As shown in FIGS. 3 to 4, in one or more embodiments, the connecting groove 134 include a first connecting groove 135 and a second connecting groove 136; the first connecting groove 135 and the second connecting groove 136 are connected to each other, and a closed-loop through-groove structure is provided. The connecting groove 134 includes a first connecting groove 135 and a second connecting groove 136, and are connected to each other to provide a closed through groove; as the example closed through groove has only two via holes, the size of the example via hole limits the size of the thin film transistor 120, while the size of the through groove of the present application does not limit the size of the thin film transistor 120, and the outer ring is not limited to the thin film transistor 120, and even if the through groove is large, it does not affect the size of the thin film transistor 120.

As shown in FIG. 4, in one or more embodiments, the width of the first connecting groove 135 is equal to that of the second connecting groove 136, and the length of the first connecting groove 135 is equal to that of the second connecting groove 136. The width of the first connecting groove 135 is W1, the width of the second connecting groove 136 is W2, and the width of the through groove is equal to that of the via hole; the length of the first connecting groove 135 is L1, the length of the second connecting groove 136 is L2, and the two lengths are the same; the entire connecting groove is provided with a closed through groove; no additional adjustment is required during the manufacture procedure, and the length and width of the through groove are consistent; the manufacture procedure is stable, and the mobility of electrons is not reduced due to the difference in the entire width of the through groove, so as not to affect the conduction of the source electrode 127 and the drain electrode 128.

In one or more embodiments, the width range of the connecting groove is 3 μm-15 μm. Therefore, the size range of the through groove may be 3 μm-15 μm, and the size of the thin film transistor 120 may not be affected by the large size, but in order to prevent the problem of over-etching, it is suitable to be in such range to prevent the insulating layer 123 from being thinned.

As shown in FIG. 4, in one or more embodiments, the closed through-groove structure is quadrangular. As seen from the top view, the two connection grooves are provided with a closed-loop quadrilateral through groove, the size of the quadrilateral closed through-groove structure does not limit the size of the thin film transistor 120, and the outer ring is not limited to the thin film transistor 120, and even if the closed through-groove structure is large, the size of the thin film transistor 120 is not affected.

As shown in FIGS. 2 to 4, as another embodiment of the present application, it discloses an array substrate 110. The array substrate includes a thin film transistor 120, and the thin film transistor 120 includes a substrate 121, a first metal layer 122, an insulating layer 123, a semiconductor 124, a barrier layer 125, a second metal layer 126, a first passivation layer 131, a pixel electrode 129; the first metal layer is disposed on the surface of the substrate 121; the insulating layer 123 covers the surface of the first metal layer 122; the semiconductor layer 124 covers the surface of the insulating layer 123; the barrier layer 125 covers the surfaces of the semiconductor layer 124 and the insulating layer 123; the second metal layer 126 covers the surface of the barrier layer 125; the second metal layer 126 includes a source electrode 127 and a drain electrode 128; the first passivation layer 131 covers the surface of the second metal layer 126; the pixel electrode 129 is disposed above the first passivation layer 131; a connecting groove 134 is arranged on the barrier layer 125 corresponding to the position of the source electrode 127 and the drain electrode 128, and the connecting groove 134 includes a first connecting groove 135 and a second connecting groove 136; the first connecting groove 135 and the second connecting groove 136 are connected to each other, and are provided with an annular through groove, connecting the connection source 127, drain electrode 128 and semiconductor layer 124; the width of the first connecting groove 135 is equal to that of the second connecting groove 136, and the width range is 3 µm-15 µm.

In this solution, the annular through groove is consist of two small connection grooves; compared with exemplary small thin film transistor 120, the etching area of the solution is smaller than the exemplary etching area; the exemplary etching area is larger, etching tends to be not uniform (incomplete etching or over-etching), and over-etching easily causes the insulating layer 123 under the barrier layer 125 to be etched, thus the insulating layer 123 film is thinned, which can easily cause electric leakage; the etching area of the annual through groove in the application is small, which prevents incomplete etching and abnormal picture due to damage of over-etching of the barrier layer 125 to the insulating layer 123; the application has certain advantages for the pixel design of panels with large size and high resolution requirement.

Figure 5:
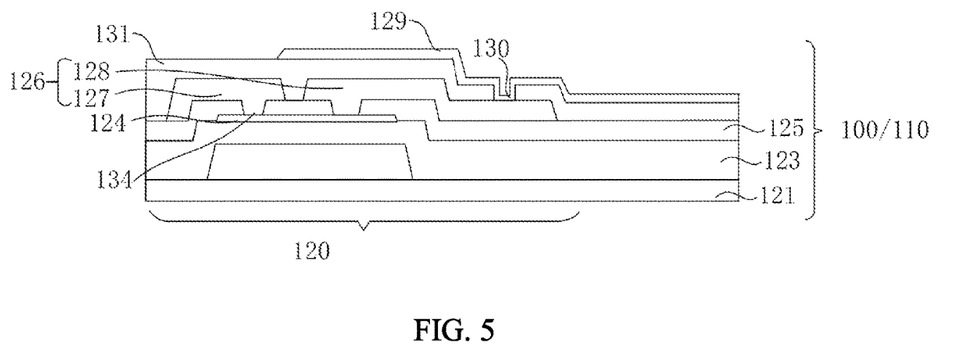
FIG. 5 is a schematic diagram of the connecting groove AA' of a thin film transistor of one or more embodiments of the present application.

As shown in FIG. 5, in one or more embodiments, the thin film transistor 120 includes a contact hole 130, the first contact hole 130 penetrates through the first passivation layer 131, and a pixel electrode 129 is connected to the drain electrode 128 through the first contact hole 130. The first passivation layer 131 covers the second metal layer 126, the first contact hole 130 penetrates through the first passivation layer 131, and the pixel electrode 129 is connected to the drain electrode 128 through the first contact hole 130 to form a via.

Figure 6:
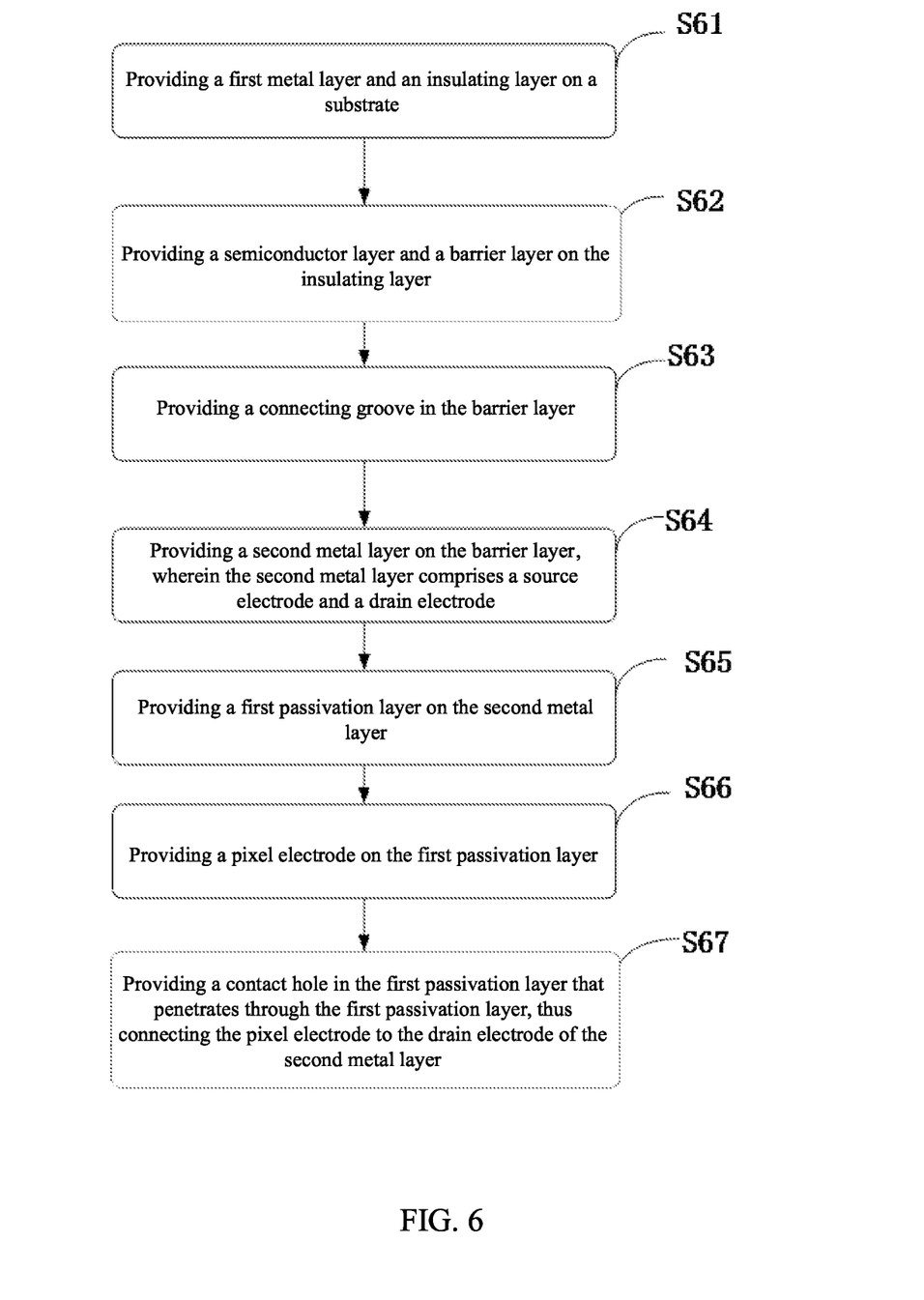
FIG. 6 is a schematic diagram of a manufacturing method of an array substrate of one or more embodiments of the present application.

As shown in FIG. 6, as another embodiment of the present application, it discloses a manufacturing method of an array substrate. The manufacturing method includes:

S61: providing a first metal layer and an insulating layer on the substrate;

S62: providing a semiconductor layer and a barrier layer on the insulating layer;

S63: providing a connecting groove in the barrier layer;

S64: providing a second metal layer on the barrier layer, where the second metal layer includes a source electrode and a drain electrode;

S65: providing a first passivation layer on the second metal layer;

S66: providing a pixel electrode on the first passivation layer, and

Figure 7:
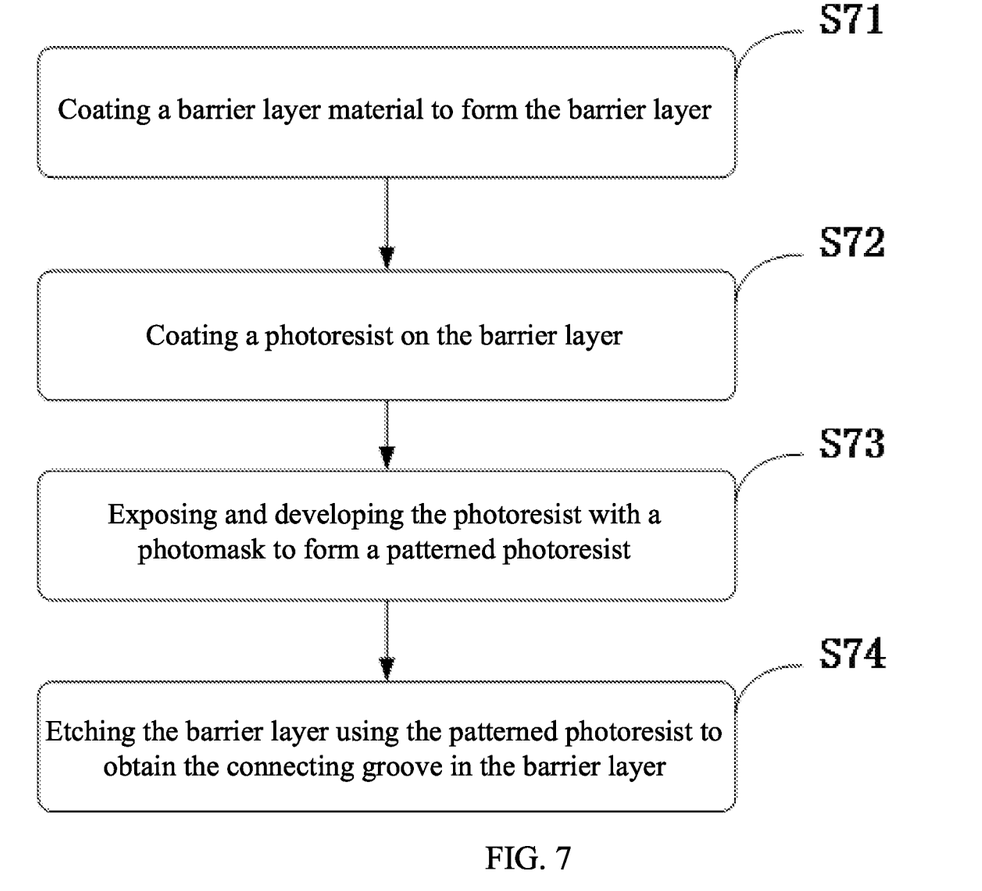
FIG. 7 is a schematic diagram of a manufacturing method of a connecting groove of one or more embodiments of the present application.

S67: providing a contact hole in the first passivation layer that penetrates through the first passivation layer, thus connecting the pixel electrode to the drain electrode of the second metal layer;

where the connecting groove is defined in the barrier layer corresponding to positions of the source electrode and the drain electrode, where one and of the connecting groove is connected to the source electrode and the semiconductor layer, and another end of the connecting groove is connected to the drain electrode and the semiconductor layer. As shown in FIG. 7, in one or more embodiments, the connecting groove being created by the following operations:

S71: coating a barrier layer material to form the barrier layer;

S72: coating a photoresist on the barrier layer;

S73: exposing and developing the photoresist with a photomask to form a patterned photoresist; and S74: etching the barrier layer using the patterned photoresist to obtain the connecting groove.

As shown in FIGS. 1 to 7, as another embodiment of the present application, it discloses a display panel 100. A display panel 100 includes an array substrate 110, and the array substrate 110 includes a thin film transistor 120 and the thin film transistor 120 includes: a substrate 121; a first metal layer 122 disposed on the surface of the substrate 121; an insulating layer 123 covering the surface of the first metal layer 122; a semiconductor layer 124 covering the surface of the insulating layer 123; a barrier layer 125 covering the surfaces of the semiconductor layer 124 and the insulating layer 123; a second metal layer 126 covering the surface of the barrier layer 125, and the second metal layer 126 including a source electrode and a drain electrode; a first passivation layer 131 covering the surface of the second metal layer 126; a pixel electrode 129 disposed above the first passivation layer 131; wherein, a connecting groove 134 is arranged on the barrier layer 125 corresponding to the position of the source electrode 127 and the drain electrode 128, one end of the connecting groove 134 is connected to the source electrode 128 and the semiconductor layer 124, and the other end is connected to the drain electrode 128 and the semiconductor layer 124.

In this solution, the display panel 100 of the solution is applicable to the display that is adjacent to the pixel electrode 129 above the first passivation layer 131, and is also applicable to the panel having other layers above the first passivation layer 131, with all layers clinging to the surface; the pixel electrode 129 is disposed above the first passivation layer 131, and the possibility of other layers above the first passivation layer 131 is not excluded; the first metal layer 122 is a gate electrode; compared with the small size area of the exemplary thin film transistor 120, the etching area of this solution is small, and the barrier layer 125 is still retained in other areas; therefore, the barrier layer 125 covers the insulating layer 123, which prevents abnormal picture due to damage of over-etching of the barrier layer to the insulating layer; the application has certain advantages for the pixel design of display panels with large size and high resolution requirement.

In one or more embodiments, the connecting groove 134 include a first connecting groove 135 and a second connecting groove 136; the first connecting groove and the second connecting groove are connected to each other, and a closed-loop through-groove structure is arranged.

The connecting groove 134 includes a first connecting groove 135 and a second connecting groove 136, and are connected to each other to provide a closed through groove; as the example closed through groove has only two via holes, the size of the example via hole limits the size of the thin film transistor 120, while the size of the through groove of the present application does not limit the size of the thin film transistor 120.

In one or more embodiments, the width of the first connecting groove 135 is equal to that of the second connecting groove 136.

In this solution, the width of the first connecting groove 135 is W1, the width of the second connecting groove 136 is W2, and the width of the through groove is equal to that of the via hole; the manufacturing process is stable, and the mobility of electrons is not reduced due to the difference in the entire width of the through groove, so as not to affect the conduction of the source electrode 127 and the drain electrode 128.

In one or more embodiments, the length of the first connecting groove 135 is equal to that of the second connecting groove 136.

In this solution, the length of the first connecting groove 135 is L1, and the length of the second connecting groove 136 is L2; these two lengths are the same and the manufacture procedure does not need additional adjustment.

In one or more embodiments, the connecting groove 134 includes a first connection grove 135; the first connecting groove 135 connects the source electrode 127 and the drain electrode 128 to arrange an open-loop through-groove structure.

In this solution, compared with the previous embodiment, the area of the through groove becomes smaller, the etched area corresponds to the through groove area, and the etched area is smaller.

In one or more embodiments, the insulating layer is a gate-oxide insulating layer, which is easy to block the mobility of electrons and has a good insulating effect.

In one or more embodiments, the thin film transistor further includes a third contact hole through which the source electrode is coupled to the semiconductor layer and a second contact hole through which the drain electrode is coupled to the semiconductor layer, where the third contact hole is in communication with the second contract hole thus forming a through hole. In view of the above description, the third contact hole may be the first connecting groove, the second contact hole may be the second connecting groove, and the through hole composed of the third contact hole and the second contact hole may the connecting groove as described supra.

In one or more embodiments, the first contact hole, the second contact hole and the third contact hole have the same shape. The range of electron migration is the same, thus the components will not be damaged due to unbalanced electron transport caused by too big contact holes.

It should be noted that, the limitation of the steps involved in this solution, without affecting the implementation of the specific solution, it is not determined to limit the sequence of steps, and the previous steps may be executed first, later, or even simultaneously, and shall be deemed to fall within the scope of the present application as long as the solution can be implemented.

The technical solution of the present application can be applied to a wide variety of display panels, such as TN type display panels (referred to as twisted nematic panels), IPS type display panels (In-Plane Switching), VA type display panels (Vertical Alignment), and, of course, other types of display panels, such as Organic Light Emitting Diode (OLED).

The above content is a further detailed description of the present application in conjunction with specific embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. An array substrate comprising a thin film transistor, and the thin film transistor comprising:
    a substrate;
    a first metal layer disposed on a surface of the substrate;
    an insulating layer covering a surface of the first metal layer;
    a semiconductor layer covering a surface of the insulating layer;
    a barrier layer covering surfaces of the semiconductor layer and the insulating layer;
    a second metal layer covering a surface of the barrier layer, and the second metal layer comprises a source electrode and a drain electrode;
    a first passivation layer covering a surface of the second metal layer;
    a pixel electrode disposed above the first passivation layer;
    wherein, a connecting groove is defined in the barrier layer corresponding to positions of the source electrode and the drain electrode, wherein one end of the connecting groove is connected to the source electrode and the semiconductor layer, and another end of the connecting groove is connected to the drain electrode and the semiconductor layer.

2. The array substrate according to claim 1, wherein the connecting groove comprises a first connecting groove and a second connecting groove;
    wherein the first connecting groove and the second connecting groove are connected to each other, forming a closed-loop through-groove structure.

3. The array substrate according to claim 2, wherein A width of the first connecting groove is equal to that of the second connecting groove.

4. The array substrate according to claim 3, wherein A width of the connecting groove ranges from 3 microns to 15 microns.

5. The array substrate according to claim 2, wherein A length of the first connecting groove is equal to a length of the second connecting groove.

6. The array substrate according to claim 2, wherein the closed-loop through-groove structure has a quadrilateral through-groove shape.

7. The array substrate according to claim 1, wherein the connecting groove comprises a first connecting groove;
    the first connecting groove is co to the source electrode and to the drain electrode, and has an open-loop through-groove structure.

8. The array substrate according to claim 1, wherein the thin film transistor comprises:
    a color photoresist layer covering a surface of the first passivation layer;
    a second passivation layer covering a surface of the second color photoresist layer;
    the pixel electrode covering a surface of the second passivation layer; and
    a contact hole penetrating through the first passivation layer, the color photoresist layer and the second passivation layer, and the pixel electrode is connected to the drain electrode through the contact hole.

9. The array substrate according to claim 1, wherein the thin film transistor comprises a contact hole penetrating through the first passivation layer, and the pixel electrode is connected to the drain electrode through the contact hole.

10. The array substrate according to claim 1, wherein the first metal layer is a gate electrode.

11. A manufacturing method of an array substrate, comprising:
    providing a first metal hr and an insulating layer on a substrate;
    providing a semiconductor layer and a barrier layer on the insulating layer;
    providing a connecting groove in the barrier layer;

providing a second metal layer on the barrier layer, wherein the second metal layer comprises a source electrode and a drain electrode;

providing a first passivation layer on the second metal layer;

providing a pixel electrode on the first passivation layer; and providing a contact hole in the first passivation layer that penetrates through the first passivation layer, thus connecting the pixel electrode to the drain electrode of the second metal bar;

wherein the connecting groove is defined in the barrier layer corresponding to positions of the source electrode and the drain electrode, wherein one end of the connecting groove is connected to the source electrode and the semiconductor layer, and another end of the connecting groove is connected to the drain electrode and the semiconductor layer.

12. The manufacturing method of an array substrate according to claim 1, wherein the connecting groove is created by the following operation:

coating a barrier layer material to form the barrier layer;

coating a photoresist on the barrier layer;

exposing and developing the photoresist with a photomask to form a patterned photoresist;

etching the barrier layer using the patterned photoresist to obtain the connecting groove in the barrier layer.

13. A display panel comprising an array substrate, the array substrate comprising a thin film transistor, and the thin film transistor comprising:

a substrate;

a first metal layer disposed on a surface of the substrate;

an insulating layer covering a surface of the first metal layer;

a semiconductor layer covering a surface of the insulating layer;

a barrier layer covering surfaces of the semiconductor layer and the insulating layer;

a second metal layer covering a surface of the barrier layer, wherein the second metal layer comprises a source electrode and a drain electrode;

a first passivation layer covering a surface of the second metal layer;

a pixel electrode disposed above the first passivation layer;

wherein, a connecting groove is defined in the barrier layer corresponding to positions of the source electrode and the drain electrode, wherein one end of the connecting groove is connected to the source electrode and the semiconductor layer, and another end of the connecting groove is connected to the drain electrode and the semiconductor layer.

14. The display panel according to claim 13, wherein the connecting groove comprises a first connecting groove and a second connecting groove;

wherein the first connecting groove and the second connecting groove are connected to each other, forming a closed-loop through-groove structure.

15. The display panel according to claim 14, wherein a width of the first connecting groove is equal to that of the second connecting groove.

16. The display panel according to claim 4, wherein a length of the first connecting groove is equal to that of the second connecting groove.

17. The display panel according to claim 13, wherein the connecting groove comprises a first connecting groove and a second connecting groove; wherein the first connecting groove is connected to the source electrode and to the drain electrode, and has an open-loop through-groove structure.

18. The display panel according to claim 13, wherein the insulating layer is a gate-oxide insulating layer.

* * * * *